United States Patent
Li et al.

(10) Patent No.: US 10,490,720 B2
(45) Date of Patent: Nov. 26, 2019

(54) MICRO LIGHT-EMITTING DEVICE AND DISPLAY APPARATUS

(71) Applicant: PlayNitride Inc., Tainan (TW)

(72) Inventors: Yun-Li Li, Tainan (TW); Yu-Chu Li, Tainan (TW); Pei-Hsin Chen, Tainan (TW)

(73) Assignee: PlayNitride Inc., Hsinchu County (TW)

( * ) Notice: Subject to any disclaimer, the term of this patent is extended or adjusted under 35 U.S.C. 154(b) by 0 days.

(21) Appl. No.: 15/867,722

(22) Filed: Jan. 11, 2018

(65) Prior Publication Data

US 2019/0019928 A1    Jan. 17, 2019

(30) Foreign Application Priority Data

Jul. 11, 2017    (TW) .............................. 106123135 A

(51) Int. Cl.
*H01L 33/62* (2010.01)
*H01L 33/38* (2010.01)
(Continued)

(52) U.S. Cl.
CPC .......... *H01L 33/62* (2013.01); *H01L 25/0753* (2013.01); *H01L 27/1214* (2013.01);
(Continued)

(58) Field of Classification Search
CPC ....... H01L 33/62; H01L 33/382; H01L 33/44; H01L 33/28; H01L 33/30; H01L 33/32; H01L 25/0753; H01L 27/1214
(Continued)

(56) References Cited

U.S. PATENT DOCUMENTS

2005/0211997 A1* 9/2005 Suehiro .................. H01L 33/20
257/88
2011/0240123 A1* 10/2011 Lin ..................... H01L 31/0296
136/260
(Continued)

FOREIGN PATENT DOCUMENTS

TW    201620166    6/2016

OTHER PUBLICATIONS

"Office Action of Taiwan Counterpart Application", dated Oct. 3, 2017, p. 1-p. 4.

*Primary Examiner* — Tong-Ho Kim
(74) *Attorney, Agent, or Firm* — JCIPRNET

(57) ABSTRACT

A micro light-emitting device includes an epitaxial structure, a first type pad, a second type pad, and a current commanding structure. The epitaxial structure includes a first type semiconductor layer, a light-emitting layer, and a second type semiconductor layer. The first type pad is electrically connected to the first type semiconductor layer. The second type pad is electrically connected to the second type semiconductor layer. The current commanding structure is disposed between the second type semiconductor layer and the second type pad. A contact resistance between the second type semiconductor layer and the current commanding structure is smaller than a contact resistance between the second type semiconductor layer and the second type pad. An orthogonal projection area of the current commanding structure on the second type semiconductor layer is smaller than an orthogonal projection area of the second type pad on the second type semiconductor layer.

20 Claims, 9 Drawing Sheets

(51) Int. Cl.
*H01L 33/44* (2010.01)
*H01L 25/075* (2006.01)
*H01L 27/12* (2006.01)
*H01L 33/14* (2010.01)
*H01L 33/32* (2010.01)
*H01L 33/28* (2010.01)
*H01L 33/30* (2010.01)
*H01L 33/20* (2010.01)

(52) U.S. Cl.
CPC ............ H01L 33/14 (2013.01); H01L 33/382 (2013.01); H01L 33/44 (2013.01); *H01L 33/20* (2013.01); *H01L 33/28* (2013.01); *H01L 33/30* (2013.01); *H01L 33/32* (2013.01); *H01L 2933/0016* (2013.01)

(58) Field of Classification Search
USPC .......................................................... 257/72
See application file for complete search history.

(56) References Cited

U.S. PATENT DOCUMENTS

2013/0193474 A1* 8/2013 Kim ..................... H01L 33/46
257/99
2018/0190878 A1* 7/2018 Li ........................ H01L 33/465

\* cited by examiner

MICRO LIGHT-EMITTING DEVICE AND DISPLAY APPARATUS

CROSS-REFERENCE TO RELATED APPLICATION

This application claims the priority benefit of Taiwan application serial no. 106123135, filed on Jul. 11, 2017. The entirety of the above-mentioned patent application is hereby incorporated by reference herein and made a part of this specification.

BACKGROUND OF THE INVENTION

Field of the Invention

The invention relates to a semiconductor device and a display apparatus, and more particularly relates to a micro light-emitting device and a display apparatus using the micro light-emitting device.

Description of Related Art

A light-emitting device, for example, a light-emitting diode (LED), is capable of emitting light by using an electronic current to drive a light-emitting layer of the LED. At present, LED still faces many technical challenges, and the efficiency droop effect of LED is one of such challenges.

More specifically, when a LED is in the operating range of a current density, it corresponds to an external quantum efficiency (EQE) peak. As the current density of the LED continues to rise, the external quantum efficiency drops correspondingly, and this phenomenon is the efficiency droop effect of LED. Generally speaking, in order to enable the LED to emit high-brightness light, the current density of the LED is usually in a relatively high current density operating range. However, for a micro light-emitting diode, which has been developed through miniaturization of LED, the external quantum efficiency is limited in the relatively high current density operating range. Thus, how to suppress the efficiency droop effect while improving the light-emitting efficiency of micro light-emitting diode is an issue that needs to be addressed. Since the micro light-emitting diode is far smaller than the conventional LED, how to prevent sidewall leakage is also an issue.

SUMMARY OF THE INVENTION

The invention provides a micro light-emitting device that has better light-emitting efficiency.

The invention further provides a display apparatus that includes the above-described light-emitting device and has better display quality.

A micro light-emitting device of the invention includes an epitaxial structure, a first type pad, a second type pad, and a current commanding structure. The epitaxial structure includes a first type semiconductor layer, a light-emitting layer, and a second type semiconductor layer. The light-emitting layer is disposed on the first type semiconductor layer, and the second type semiconductor layer is disposed on the light-emitting layer. The first type pad is disposed on the epitaxial structure and electrically connected to the first type semiconductor layer. The second type pad is disposed on the epitaxial structure and electrically connected to the second type semiconductor layer. The current commanding structure is disposed between the second type semiconductor layer and the second type pad. A contact resistance between the second type semiconductor layer and the current commanding structure is smaller than a contact resistance between the second type semiconductor layer and the second type pad, and an orthogonal projection area of the current commanding structure on the second type semiconductor layer is smaller than an orthogonal projection area of the second type pad on the second type semiconductor layer.

A display apparatus of the invention includes a driving substrate and a plurality of micro light-emitting devices. The driving substrate has a plurality of pixel regions. The micro light-emitting devices are electrically connected onto the driving substrate, and at least one of the micro light-emitting devices is disposed in each of the pixel regions.

In an embodiment of the invention, the current commanding structure and the second type semiconductor layer form ohmic contact.

In an embodiment of the invention, a ratio of the orthogonal projection area of the current commanding structure on the second type semiconductor layer to the orthogonal projection area of the second type pad on the second type semiconductor layer is in a range of 0.1 to 0.9.

In an embodiment of the invention, a work function of the current commanding structure is greater than a work function of the second type semiconductor layer.

In an embodiment of the invention, a work function of the current commanding structure is greater than a work function of the second type pad.

In an embodiment of the invention, a ratio of a thickness of the second type pad to a thickness of the current commanding structure is in a range of 2 to 400.

In an embodiment of the invention, a thickness of the current commanding structure is in a range of 5 nm to 200 nm.

In an embodiment of the invention, a ratio of the orthogonal projection area of the second type pad on the second type semiconductor layer to an area of the second type semiconductor layer is in a range of 0.1 to 0.9.

In an embodiment of the invention, the current commanding structure includes a film or a patterned structure.

In an embodiment of the invention, a ratio of a horizontal distance between the current commanding structure and a closest edge of the second type semiconductor layer to a maximum width of the micro light-emitting device is greater than or equal to 0.01.

In an embodiment of the invention, the horizontal distance between the current commanding structure and the closest edge of the second type semiconductor layer is greater than or equal to 1 μm.

In an embodiment of the invention, the current commanding structure is embedded in the second type semiconductor layer.

In an embodiment of the invention, the first type pad and the second type pad are located on the same side of the light-emitting layer. The epitaxial structure further includes a through hole that sequentially penetrates the second type semiconductor layer, the light-emitting layer, and a portion of the first type semiconductor layer. The first type pad is disposed in the through hole and electrically connected to the first type semiconductor layer.

In an embodiment of the invention, the first type pad and the second type pad are located on two opposite sides of the light-emitting layer.

In an embodiment of the invention, the micro light-emitting device further includes: an insulating layer disposed on a surface of the second type semiconductor layer, wherein the insulating layer has an opening that exposes a portion of the surface of the second type semiconductor layer, and the second type pad is disposed on the opening and electrically connected to the second type semiconductor layer.

In an embodiment of the invention, the current commanding structure is disposed on the surface of the second type semiconductor layer exposed by the opening, and located between the second type semiconductor layer and the second type pad.

In an embodiment of the invention, the micro light-emitting device further includes: another current commanding structure disposed on the first type semiconductor layer, wherein a contact resistance between the first type semiconductor layer and the another current commanding structure is smaller than a contact resistance between the first type semiconductor layer and the first type pad.

In an embodiment of the invention, a work function of the current commanding structure is greater than a work function of another current commanding structure.

In an embodiment of the invention, the first type semiconductor layer is an N type semiconductor layer while the second type semiconductor layer is a P type semiconductor layer.

In an embodiment of the invention, the second type pad includes a plurality of second type sub-pads that are electrically insulated from one another, and the current commanding structure includes a plurality of patterned structures correspondingly located between the second type sub-pads and the second type semiconductor layer respectively.

In an embodiment of the invention, a current density of a region of the epitaxial structure corresponding to the current commanding structure is greater than a current density of a region of the epitaxial structure where the current commanding structure is not disposed.

Based on the above, in the micro light-emitting device of the invention, the contact resistance between the current commanding structure and the second type semiconductor layer of the epitaxial structure is smaller than the contact resistance between the second type pad and the second type semiconductor layer of the epitaxial structure. Thus, the current is further concentrated in the region where the current commanding structure is disposed, so as to improve the light-emitting efficiency of the micro light-emitting device. Moreover, the display apparatus using the micro light-emitting device of the invention has better display quality.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
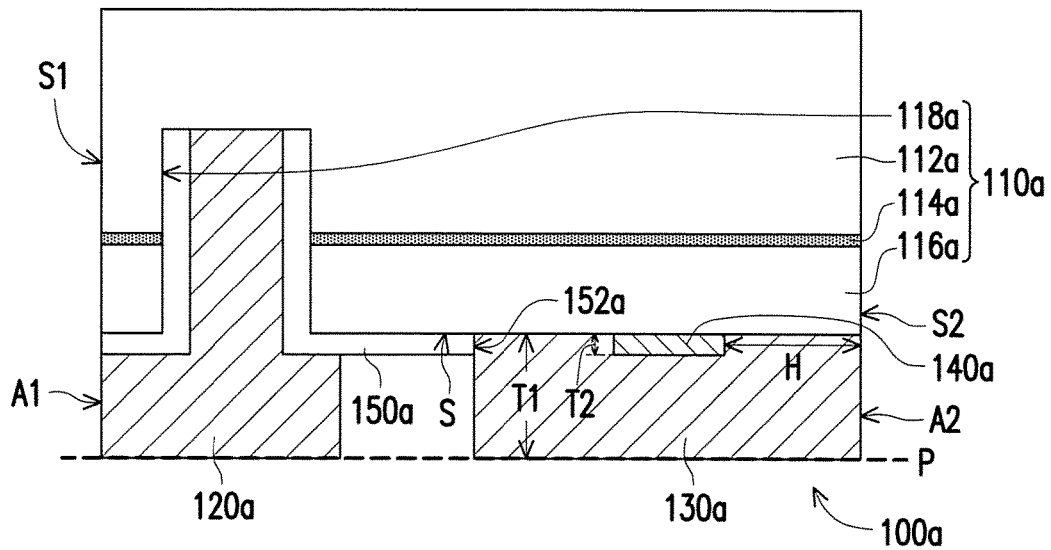
FIG. 1 is a schematic cross-sectional view of a micro light-emitting device according to an embodiment of the invention.

FIG. 1 is a schematic cross-sectional view of a micro light-emitting device according to an embodiment of the invention. Referring to FIG. 1, in this embodiment, a micro light-emitting device 100a includes an epitaxial structure 110a, a first type pad 120a, a second type pad 130a, and a current commanding structure 140a. The epitaxial structure 110a includes a first type semiconductor layer 112a, a light-emitting layer 114a, and a second type semiconductor layer 116a. The light-emitting layer 114a is disposed on the first type semiconductor layer 112a, and the second type semiconductor layer 116a is disposed on the light-emitting layer 114a. The first type pad 120a is disposed on the epitaxial structure 110a and electrically connected to the first type semiconductor layer 112a. The second type pad 130a is disposed on the epitaxial structure 110a and electrically connected to the second type semiconductor layer 116a. The current commanding structure 140a is disposed between the second type semiconductor layer 116a and the second type pad 130a, wherein a contact resistance between the second type semiconductor layer 116a and the current commanding structure 140a is smaller than a contact resistance between the second type semiconductor layer 116a and the second type pad 130a. Herein, the current commanding structure 140a is in direct contact with the second type semiconductor layer 116a. An orthogonal projection area of the current commanding structure 140a on the second type semiconductor layer 116a is smaller than an orthogonal projection area of the second type pad 130a on the second type semiconductor layer 116a.

More specifically, as shown in FIG. 1, the first type pad 120a and the second type pad 130a of this embodiment are located on the same side of the light-emitting layer 114a of the epitaxial structure 110a, wherein the micro light-emitting device 100a is embodied as a flip-chip light-emitting diode. In this embodiment, the epitaxial structure 110a further includes a through hole 118a, wherein the through hole 118a sequentially penetrates the second type semiconductor layer 116a, the light-emitting layer 114a, and a portion of the first type semiconductor layer 112a. The first type pad 120a extends from a surface S of the second type semiconductor layer 116a, which is away from the first type semiconductor layer 112a, to be disposed in the through hole 118a and electrically connected to the first type semiconductor layer 112a. Moreover, in order to effectively electrically insulate the first type pad 120a from the second type semiconductor layer 116a, the micro light-emitting device 100a of this embodiment may further include an insulating layer 150a, wherein the insulating layer 150a is disposed on the surface S of the second type semiconductor layer 116a and extends to be disposed between the first type pad 120a and the through hole 118a. The insulating layer 150a has an opening 152a, wherein the opening 152a exposes a portion of the surface S of the second type semiconductor layer 116a, and the second type pad 130a is disposed in the opening 152a to be in direct contact with and electrically connected to the second type semiconductor layer 116a. In an embodiment not shown here, the insulating layer may extend to be disposed on a sidewall of the epitaxial structure, but the invention is not limited thereto. At this time, the current commanding structure 140a is disposed on the surface S of the second type semiconductor layer 116a exposed by the opening 152a, and the current commanding structure 140a is covered by the second type pad 130a and held between the second type semiconductor layer 116a and the second type pad 130a.

More specifically, a thickness of the first type semiconductor layer 112a of this embodiment is greater than a thickness of the second type semiconductor layer 116a, wherein the first type semiconductor layer 112a is embodied as an N type semiconductor layer and a material thereof includes a II-VI group material (e.g., n-ZnSe) or a III-V group material (e.g., n-AlGaAs, n-GaAsP, n-AlGaInP, n-AlGaP, n-InGaN, n-AlN, n-InN, n-AlGaN, n-AlInGaN, n-GaN, or n-GaAs), and the second type semiconductor layer 116a is embodied as a P type semiconductor layer and a material thereof includes a II-VI group material (e.g., p-ZnSe) or a III-V group material (e.g., p-AlGaAs, p-GaAsP, p-AlGaInP, p-AlGaP, p-InGaN, p-AlN, p-InN, p-AlGaN, p-AlInGaN, p-GaN, or p-GaP), but the invention is not limited thereto. The thickness of the first type semiconductor layer 112a is in a range of 1 μm to 5 μm, a thickness of the light-emitting layer 114a is in a range of 0.1 μm to 1 μm, and the thickness of the second type semiconductor layer 116a is in a range of 0.1 μm to 0.5 μm, for example, but the invention is not limited thereto. As shown in FIG. 1, a cross-sectional shape of the epitaxial structure 110a of this embodiment is rectangular. That is, an edge of the first type semiconductor layer 112a, an edge of the light-emitting layer 114a, and an edge of the second type semiconductor layer 116a are even with one another. Herein, an edge A1 of the first type pad 120a and an edge A2 of the second type pad 130a are respectively even with edges S1 and S2 of the epitaxial structure 110a. The first type pad 120a and the second type pad 130a are formed of a high work function metal (e.g., platinum, nickel, titanium, gold, chromium, an alloy of the foregoing, and a combination of the foregoing materials), a metal oxide (e.g., indium tin oxide and zinc oxide), or a conductive non-metal material, e.g., conductive polymer, graphite, graphene, and black phosphorus.

In addition, the current commanding structure 140a of this embodiment is embodied as a single layer of conductive film. Herein, a material of the current commanding structure 140a is different from a material of the second type pad 130a. The contact resistance between the current commanding structure 140a and the second type semiconductor layer 116a is smaller than the contact resistance between the second type pad 130a and the second type semiconductor layer 116a, so as to concentrate the current between the current commanding structure 140a and the second type semiconductor layer 116a. A ratio of the orthogonal projection area of the current commanding structure 140a on the second type semiconductor layer 116a to the orthogonal projection area of the second type pad 130a on the second type semiconductor layer 116a is in a range of 0.1 to 0.9. If the ratio between the orthogonal projection areas is smaller than 0.1, the ohmic contact efficiency of the current commanding structure 140a may be affected; however, if the ratio between the orthogonal projection areas is greater than 0.9, the contact area between the current commanding structure 140a and the second type pad 130a is too large and may affect current concentration and cause current leakage. Preferably, the ratio of the orthogonal projection area of the current commanding structure 140a on the second type semiconductor layer 116a to the orthogonal projection area of the second type pad 130a on the second type semiconductor layer 116a is in a range of 0.1 to 0.6, so as to achieve better current concentration and increase ohmic contact between the current commanding structure 140a and the second type semiconductor layer 116a. A ratio of the orthogonal projection area of the second type pad 130a on the second type semiconductor layer 116a to an area of the second type semiconductor layer 116a is in a range of 0.1 to 0.9. Preferably, the ratio of the orthogonal projection area of the second type pad 130a on the second type semiconductor layer 116a to the area of the second type semiconductor layer 116a is in a range of 0.1 to 0.6. In other words, the area of the current commanding structure 140a is smaller than the area of the second type pad 130a, and the area of the second type pad 130a is smaller than the area of the second type semiconductor layer 116a, so as to further concentrate the current in the region where the current commanding structure 140a is disposed, and prevent leakage from the edge of the micro light-emitting device 100a. In particular, a current density of the region of the second type semiconductor layer 116a corresponding to the current commanding structure 140a is greater than the current densities of other regions of the epitaxial structure 110a where the current commanding structure 140a is not disposed, so as to concentrate the current in the region where the current commanding structure 140a is disposed to improve the light-emitting efficiency of the micro light-emitting device 100a. Preferably, the current density of the region of the epitaxial structure 110a of the micro light-emitting device 100a corresponding to the current commanding structure 140a falls in a range of 1 amps/cm$^2$ to 5 amps/cm$^2$. Herein, a work function of the current commanding structure 140a is greater than a work function of the second type semiconductor layer 116a, and the work function of the current commanding structure 140a is greater than a work function of the second type pad 130a, so as to achieve better hole injection.

Moreover, a ratio of an orthogonal projection area of the current commanding structure 140a of this embodiment on a plane P to an orthogonal projection area of the micro light-emitting device 100a on the plane P is in a range of 0.1 to 0.8. If the ratio between the orthogonal projection areas is greater than 0.8, current concentration may be affected. A maximum width size of the micro light-emitting device 100a is in a range of 1 µm to 150 µm, and preferably in a range of 3 µm to 50 µm, for example. The thickness of the epitaxial structure 110a of the micro light-emitting device 100a is preferably in a range of 1 µm to 6 µm, and a thicker or thinner epitaxial structure may affect the yield of subsequent processes. A ratio of a thickness T1 of the second type pad 130a to a thickness T2 of the current commanding structure 140a is in a range of 2 to 400, wherein the thickness T2 of the current commanding structure 140a is preferably a nanometer level, e.g., in a range of 5 nm to 200 nm, while the thickness of the second type pad 130a is in a range of 0.5 µm to 2 µm, for example. The current commanding structure 140a is a high work function material, e.g., a metal oxide (e.g., indium tin oxide and zinc oxide) or a conductive metal material, e.g., cobalt, nickel, gold, platinum, palladium, germanium, and an alloy thereof. Here, the current commanding structure 140a is embodied as indium tin oxide, so as to achieve favorable ohmic contact with the second type semiconductor layer 116a. A ratio of a horizontal distance H between the current commanding structure 140a and a closest edge S2 of the second type semiconductor layer 116a to the maximum width size of the micro light-emitting device 100a is greater than or equal to 0.01. Herein, the horizontal distance H is greater than or equal to 1 µm, for example, so as to prevent leakage from the edge S2 of the micro light-emitting device 100a by disposing the current commanding structure 140a away from the edge S2 of the micro light-emitting device 100a and further concentrate the light emitted by the micro light-emitting device 100a to near a center of the micro light-emitting device 100a.

In short, because the current commanding structure 140a of the micro light-emitting device 100a of this embodiment has a smaller contact resistance with the second type semiconductor layer 116a of the epitaxial structure 110a, the current is further concentrated in the region where the current commanding structure 140a is disposed, so as to improve the light-emitting efficiency of the micro light-emitting device 100a.

It should be noted that the reference numerals and part of the contents of the previous embodiment are used in the following embodiments, in which identical reference numerals indicate identical or similar components, and descriptions of the same technical contents are omitted. Please refer to the description of the previous embodiment for the omitted contents, which will not be repeated hereinafter.

Figure 2:
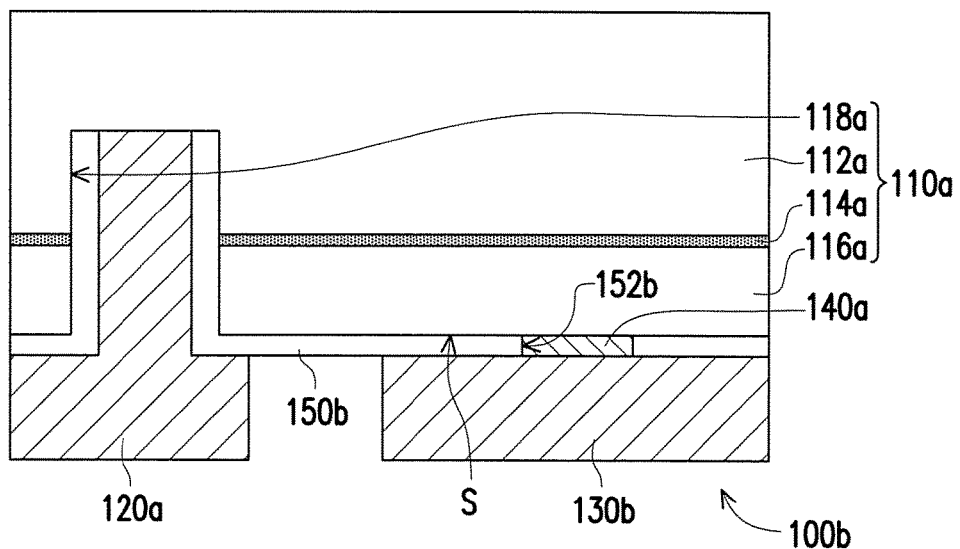
FIG. 2 is a schematic cross-sectional view of a micro light-emitting device according to another embodiment of the invention.

FIG. 2 is a schematic cross-sectional view of a micro light-emitting device according to another embodiment of the invention. Referring to FIG. 1 and FIG. 2, a micro light-emitting device 100b of this embodiment is similar to the micro light-emitting device 100a of FIG. 1, and a difference therebetween is that: an insulating layer 150b of this embodiment further extends to be disposed between the second type semiconductor layer 116a and a second type pad 130b. More specifically, the insulating layer 150b of this embodiment has an opening 152b, and the opening 152b exposes a portion of the surface S of the second type semiconductor layer 116a. The current commanding structure 140a is disposed on the surface S exposed by the opening 152b, and located between the second type semiconductor layer 116a and the second type pad 130b. Herein, the current commanding structure 140a is conformal with the opening 152b. However, in an embodiment not shown here, the current commanding structure may be lower or higher than a surface of the opening, which also falls within the scope of the invention.

Figure 3:
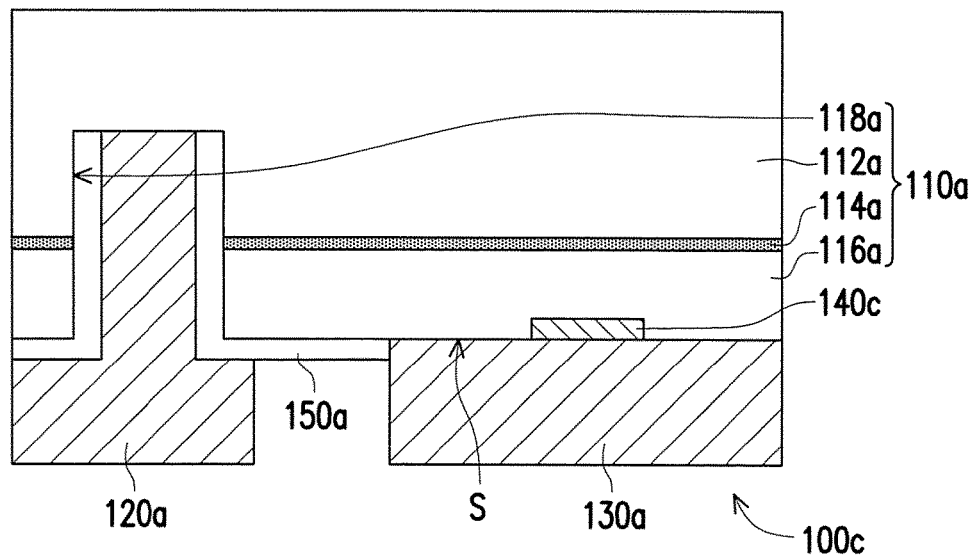
FIG. 3 is a schematic cross-sectional view of a micro light-emitting device according to another embodiment of the invention.

FIG. 3 is a schematic cross-sectional view of a micro light-emitting device according to another embodiment of the invention. Referring to FIG. 1 and FIG. 3, a micro light-emitting device 100c of this embodiment is similar to the micro light-emitting device 100a of FIG. 1, and a difference therebetween is that: a current commanding structure 140c of this embodiment is embedded in the second type semiconductor layer 116a, such that the current commanding structure 140c and the second type semiconductor layer 116a have a larger contact area to increase the ohmic contact efficiency.

Figure 4:
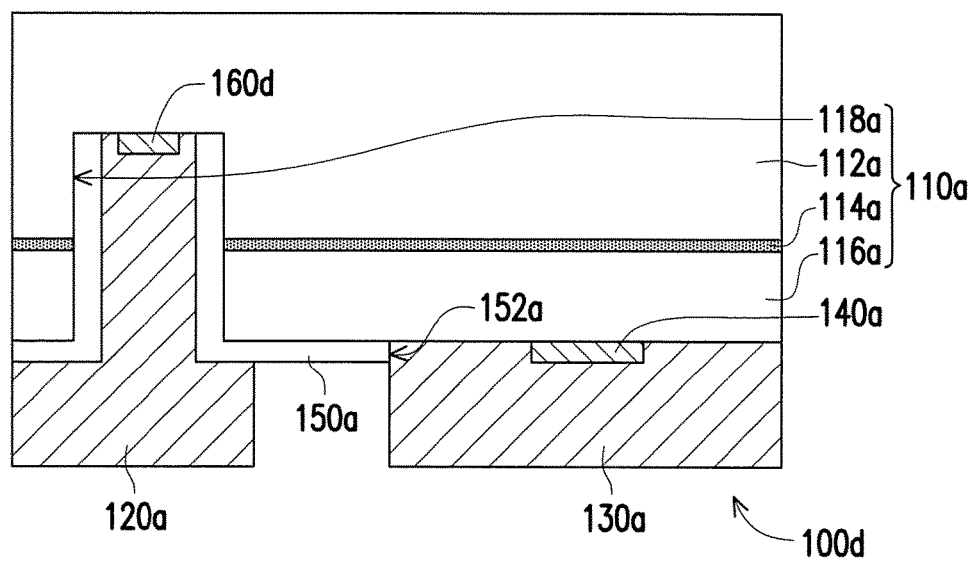
FIG. 4 is a schematic cross-sectional view of a micro light-emitting device according to another embodiment of the invention.

FIG. 4 is a schematic cross-sectional view of a micro light-emitting device according to another embodiment of the invention. Referring to FIG. 1 and FIG. 4, a micro light-emitting device 100d of this embodiment is similar to the micro light-emitting device 100a of FIG. 1, and a difference therebetween is that: the micro light-emitting device 100d of this embodiment further includes another current commanding structure 160d disposed on the first type semiconductor layer 112a and located in the through hole 118a. The another current commanding structure 160d is in direct contact with the first type semiconductor layer 112a, and the first type semiconductor layer 112a forms ohmic contact. A contact resistance between the another current commanding structure 160d and the first type semiconductor layer 112a is smaller than a contact resistance between the first type pad 120a and the first type semiconductor layer 112a, so as to achieve better current concentration efficiency. The another current commanding structure 160d is a low work function material, and the work function of the current commanding structure 140a is greater than the work function of the another current commanding structure 160d. A material of the another current commanding structure 160d is a metal material, e.g., titanium, aluminum, and an alloy thereof, so as to achieve better electron injection.

Figure 5:
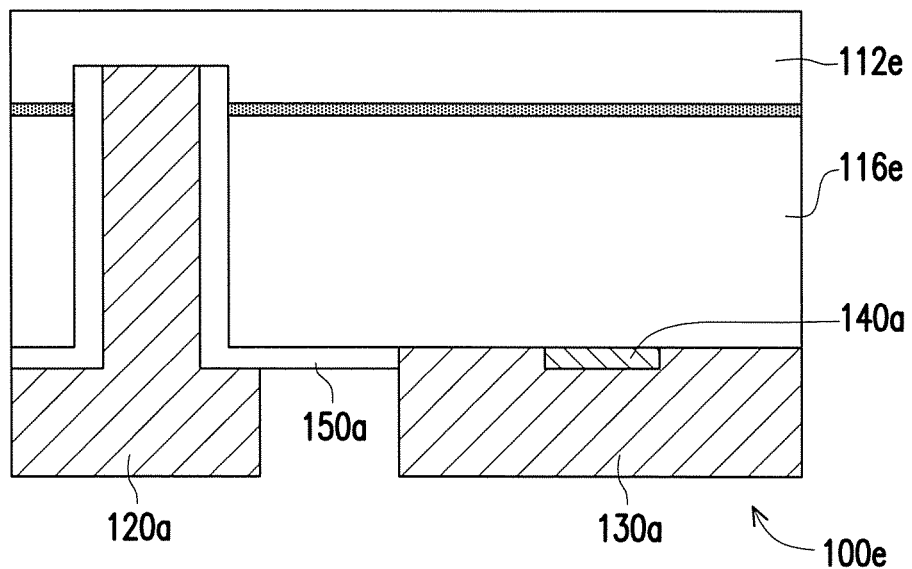
FIG. 5 is a schematic cross-sectional view of a micro light-emitting device according to another embodiment of the invention.

FIG. 5 is a schematic cross-sectional view of a micro light-emitting device according to another embodiment of the invention. Referring to FIG. 1 and FIG. 5, a micro light-emitting device 100e of this embodiment is similar to the micro light-emitting device 100a of FIG. 1, and a difference therebetween is that: a thickness of a first type semiconductor layer 112e of this embodiment is smaller than a thickness of a second type semiconductor layer 116e, wherein the first type semiconductor layer 112e is embodied as a P type semiconductor layer while the second type semiconductor layer 116e is embodied as an N type semiconductor layer.

Figure 6:
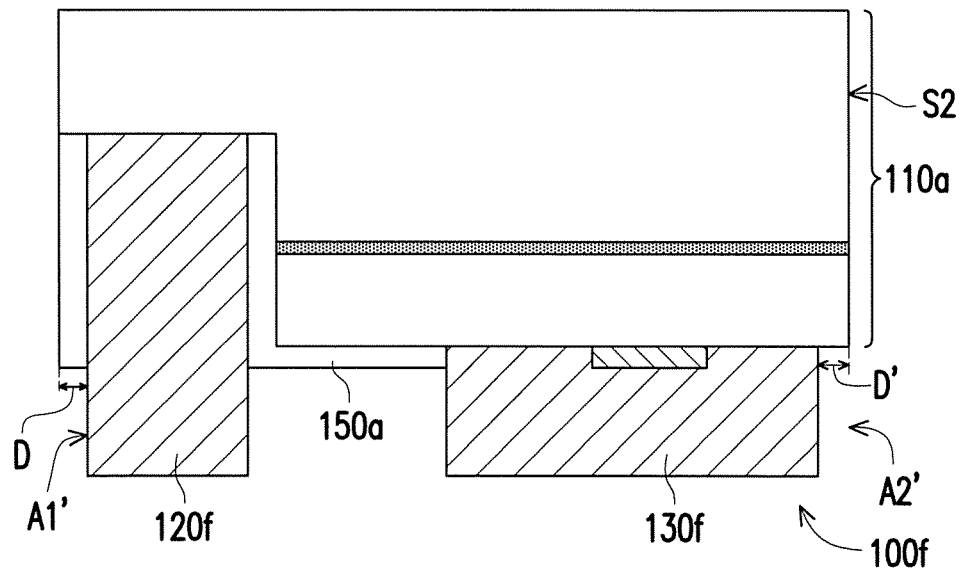
FIG. 6 is a schematic cross-sectional view of a micro light-emitting device according to another embodiment of the invention.

FIG. 6 is a schematic cross-sectional view of a micro light-emitting device according to another embodiment of the invention. Referring to FIG. 1 and FIG. 6, a micro light-emitting device 100f of this embodiment is similar to the micro light-emitting device 100a of FIG. 1, and a difference therebetween is that: an edge A2' of the second type pad 130a and a side S2 of the epitaxial structure 110a of this embodiment retract by a distance D' while an edge A1' of a first type pad 120f and a side S1 of the epitaxial structure 110a retract by a distance D, wherein the distances D and D' may be greater than or equal to 1 µm, so as to prevent sidewall leakage. In an embodiment not shown here, only the second type pad or the first type pad retracts, but the invention is not limited thereto.

Figure 7:
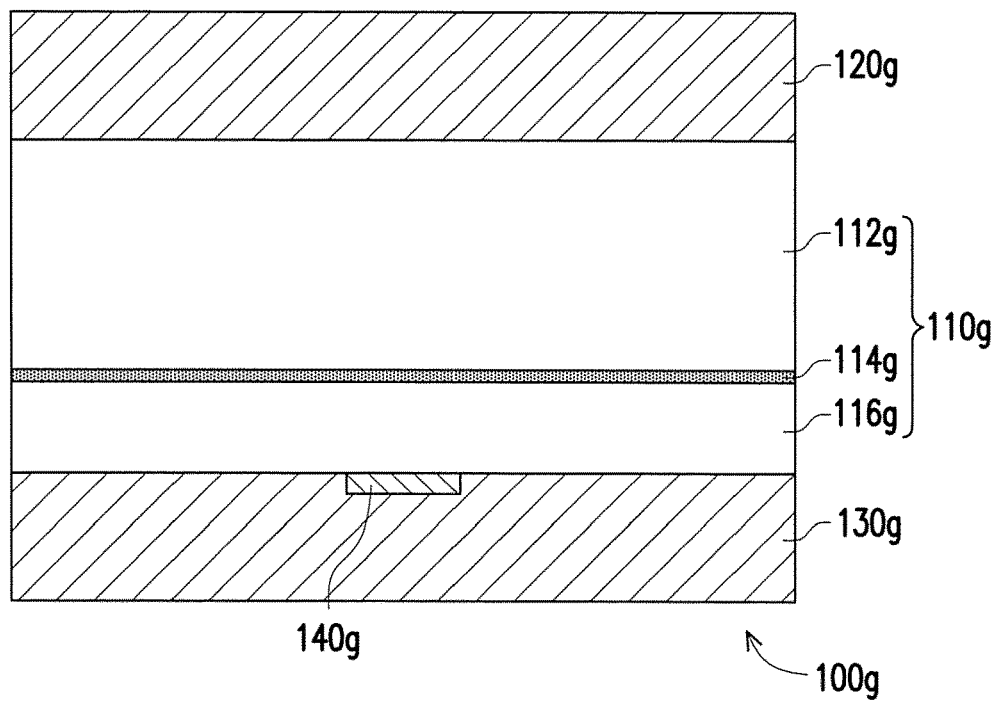
FIG. 7 is a schematic cross-sectional view of a micro light-emitting device according to another embodiment of the invention.

FIG. 7 is a schematic cross-sectional view of a micro light-emitting device according to another embodiment of the invention. Referring to FIG. 1 and FIG. 7, a micro light-emitting device 100g of this embodiment is similar to the micro light-emitting device 100a of FIG. 1, and a difference therebetween is that: the micro light-emitting device 100g of this embodiment is embodied as a vertical light-emitting diode. More specifically, a first type pad 120g and a second type pad 130g of this embodiment are respectively located on two opposite sides of a light-emitting layer 114g, and a cross-sectional shape of an epitaxial structure 110g includes a rectangular shape. An edge of the first type pad 120g, an edge of the first type semiconductor layer 112g, an edge of the light-emitting layer 114g, and edges of the second type semiconductor layer 116g and the second type pad 130g are even with one another, but the invention is not limited thereto. A current commanding structure 140g is in direct contact with the second type semiconductor layer 116g and located between the second type semiconductor layer 116g and the second type pad 130g. Herein, the first type semiconductor layer 112g is embodied as an N type semiconductor layer while the second type semiconductor layer 116g is embodied as a P type semiconductor layer, and the first type semiconductor layer 112g is located above the second type semiconductor layer 116g. That is, the micro light-emitting device 100g of this embodiment has a configuration with the N type electrode disposed above. It should be particularly noted that a ratio of an orthogonal projection area of the second type pad 130g on the second type semiconductor layer 116g to an orthogonal projection area on the second type semiconductor layer 116g is in a range of 0.1 to 0.9. Preferably, a ratio of the orthogonal projection area of the second type pad 130g on the second type semiconductor layer 116g to the area of the second type semiconductor layer 116g is in a range of 0.5 to 0.9, so as to increase the ohmic contact between the second type pad 130g and the second type semiconductor layer 116g and prevent leakage from the edge of the micro light-emitting device 100g.

Figure 8:
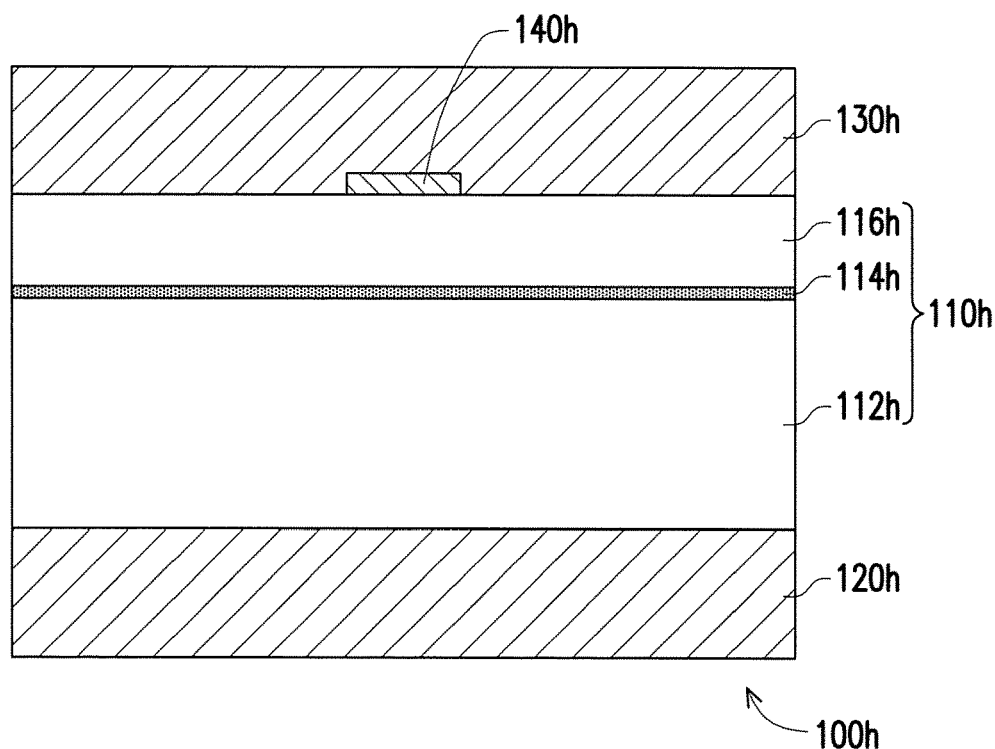
FIG. 8 is a schematic cross-sectional view of a micro light-emitting device according to another embodiment of the invention.

FIG. 8 is a schematic cross-sectional view of a micro light-emitting device according to another embodiment of the invention. Referring to FIG. 7 and FIG. 8, a micro light-emitting device 100h of this embodiment is similar to the micro light-emitting device 100g of FIG. 7, and a difference therebetween is that: a second type semiconductor layer 116h of an epitaxial structure 110h of this embodiment is located above a first type semiconductor layer 112h, and a first type pad 120h and a second type pad 130h are respectively located on two opposite sides of a light-emitting layer 114h while a current commanding structure 140h is in direct contact with the second type semiconductor layer 116h and located between the second type semiconductor layer 116h and the second type pad 130h. In short, the micro light-emitting device 100h of this embodiment has a configuration with the P type electrode disposed above.

Figure 9:
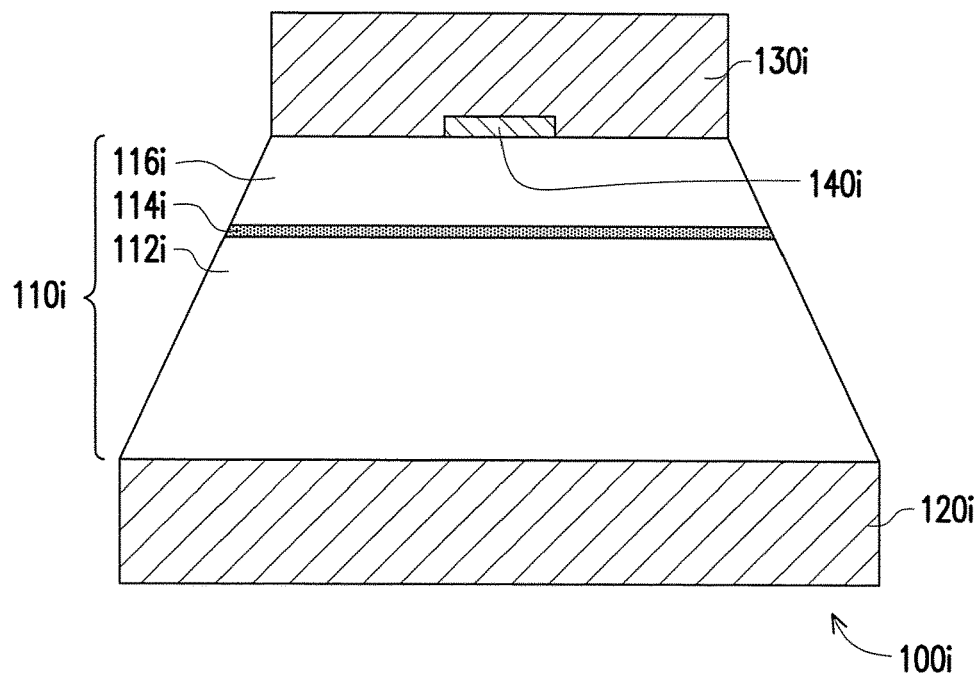
FIG. 9 is a schematic cross-sectional view of a micro light-emitting device according to another embodiment of the invention.

FIG. 9 is a schematic cross-sectional view of a micro light-emitting device according to another embodiment of the invention. Referring to FIG. 8 and FIG. 9, a micro light-emitting device 100i of this embodiment is similar to the micro light-emitting device 100h of FIG. 8, and a difference therebetween is that: a cross-sectional shape of an epitaxial structure 110i of this embodiment includes a regular trapezoid shape. That is, the area gradually increases in a direction from a second type semiconductor layer 116i to a first type semiconductor layer 112i. Herein, a maximum width difference between the first type semiconductor layer 112i and the second type semiconductor layer 116i is in a range of 0 μm to 5 μm, so as to be flexibly applied to the subsequent design. Moreover, a current commanding structure 140i is in direct contact with the second type semiconductor layer 116i of the epitaxial structure 110i to form ohmic contact, and an area of the first type pad 120i is greater than an area of the second type pad 130i.

Figure 10:
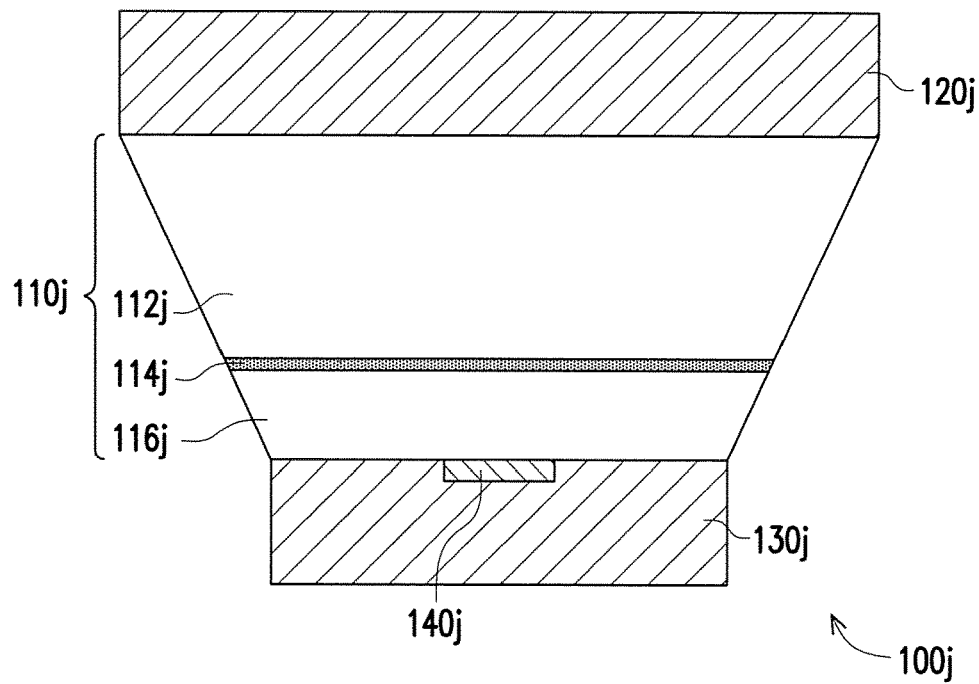
FIG. 10 is a schematic cross-sectional view of a micro light-emitting device according to another embodiment of the invention.

FIG. 10 is a schematic cross-sectional view of a micro light-emitting device according to another embodiment of the invention. Referring to FIG. 7 and FIG. 10, a micro light-emitting device 100j of this embodiment is similar to the micro light-emitting device 100g of FIG. 7, and a difference therebetween is that: a cross-sectional shape of an epitaxial structure 110j of this embodiment includes an inverted trapezoid shape. That is, the area gradually decreases in a direction from a first type semiconductor layer 112j to a second type semiconductor layer 116j. Here, a maximum width difference between the first type semiconductor layer 112j and the second type semiconductor layer 116j is in a range of 0 μm to 5 μm, so as to be flexibly applied to the subsequent design. A current commanding structure 140j is in direct contact with the second type semiconductor layer 116j of the epitaxial structure 110j to form ohmic contact, and an area of the first type pad 120j is greater than an area of the second type pad 130j.

Figure 11A:
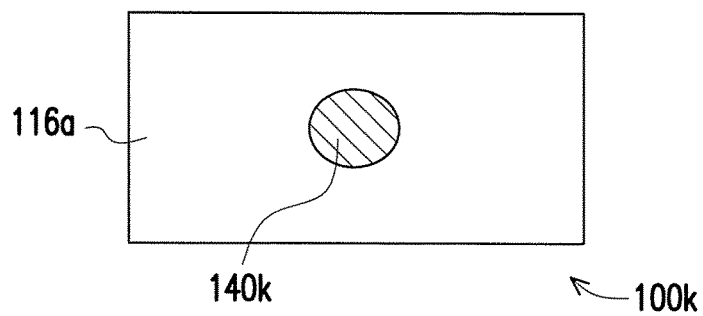
FIG. 11A is a partial bottom view of a current commanding structure and a second type semiconductor layer of a micro light-emitting device according to an embodiment of the invention.

FIG. 11A is a partial bottom view of a current commanding structure and a second type semiconductor layer of a micro light-emitting device according to an embodiment of the invention. Referring to FIG. 1 and FIG. 11A, a micro light-emitting device 100k of this embodiment is similar to the micro light-emitting device 100a of FIG. 1, and a difference therebetween is that: a current commanding structure 140k of this embodiment is embodied as a patterned structure, and a bottom pattern thereof is circular, for example, but the invention is not limited thereto. In an embodiment not shown here, it may also be polygonal, oval, or in other suitable shapes.

Figure 11B:
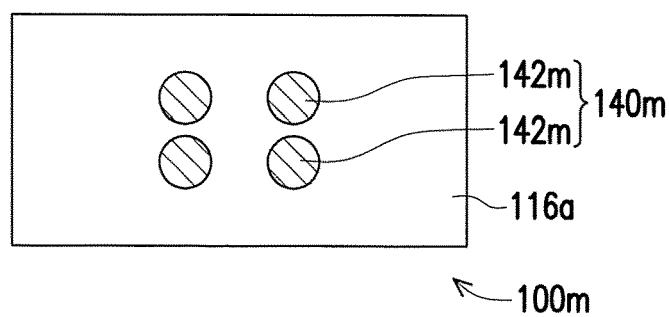
FIG. 11B is a partial bottom view of a current commanding structure and a second type semiconductor layer of a micro light-emitting device according to another embodiment of the invention.

FIG. 11B is a partial bottom view of a current commanding structure and a second type semiconductor layer of a micro light-emitting device according to another embodiment of the invention. Referring to FIG. 11A and FIG. 11B, a micro light-emitting device 100m of this embodiment is similar to the micro light-emitting device 100k of FIG. 11A, and a difference therebetween is that: a current commanding structure 140m of this embodiment is embodied as a plurality of patterned structures 142m that are separated from one another.

Figure 11C:
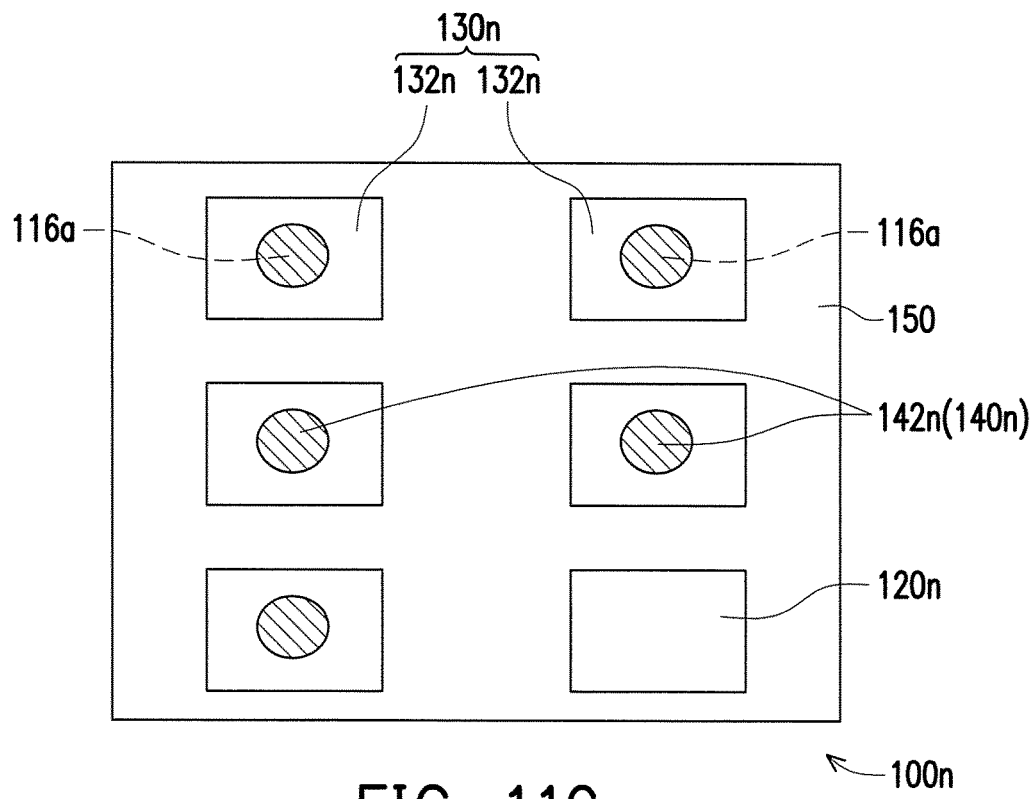
FIG. 11C is a partial bottom view of a current commanding structure, a first type pad, a second type pad, and a second type semiconductor layer of a micro light-emitting device according to another embodiment of the invention.

FIG. 11C is a partial bottom view of a current commanding structure, a first type pad, a second type pad, and a second type semiconductor layer of a micro light-emitting device according to another embodiment of the invention. Referring to FIG. 1 and FIG. 11C, a micro light-emitting device 100n of this embodiment is similar to the micro light-emitting device 100a of FIG. 1, and a difference therebetween is that: a second type pad 130n of this embodiment includes a plurality of second type sub-pads 132n that are electrically insulated from one another while a current commanding structure 140n includes a plurality of conductive patterns 142n, wherein the conductive patterns 142n are correspondingly located between the second type sub-pads 130n and the second type semiconductor layer 116a respectively and are in direct contact with the second type semiconductor layer 116a. Herein, the second type pad 130n surrounds the first type pad 120n, but the invention is not limited thereto. The micro light-emitting device 100n of this embodiment may control each second type sub-pad 132n independently through circuit control.

Figure 12A:
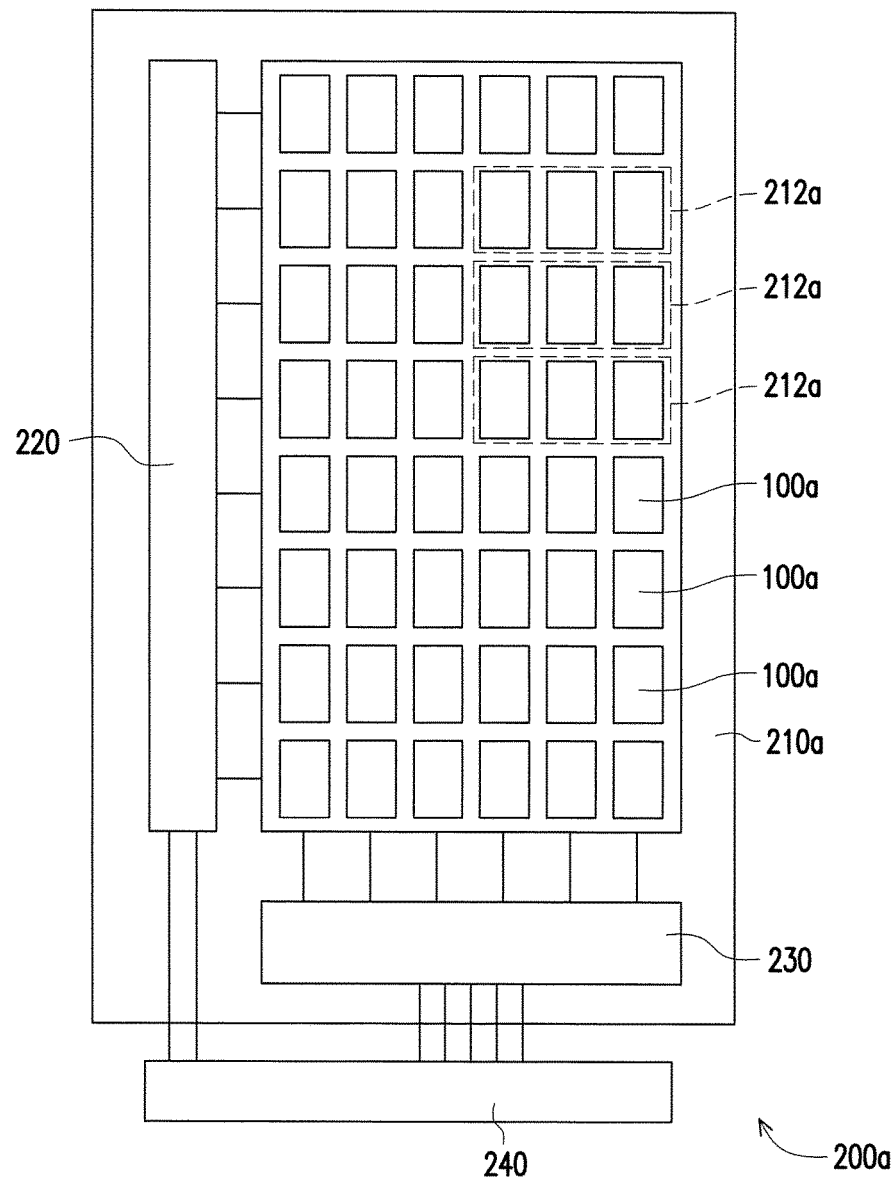
FIG. 12A is a top view of a display apparatus according to an embodiment of the invention.
Figure 12B:
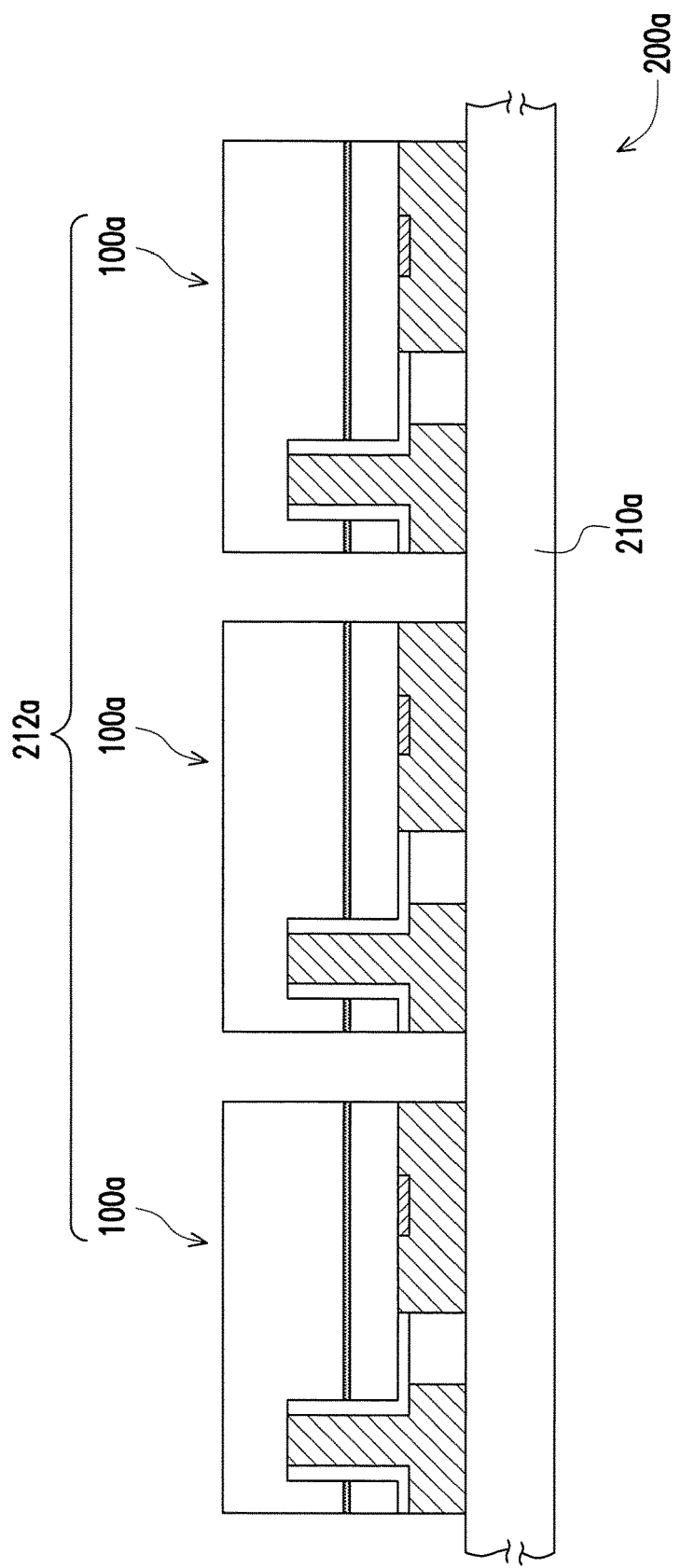
FIG. 12B is a partial cross-sectional view of the display apparatus of FIG. 12A.

FIG. 12A is a top view of a display apparatus according to an embodiment of the invention. FIG. 12B is a partial cross-sectional view of the display apparatus of FIG. 12A. Referring to FIG. 12A and FIG. 12B, in this embodiment, a display apparatus 200a includes a driving substrate 210a and a plurality of the micro light-emitting devices 100a. The driving substrate 210a has a plurality of pixel regions 212a, and the micro light-emitting devices 100a are separated from one another and disposed on the driving substrate 210a, and at least three micro light-emitting devices 100a are disposed in each pixel region 212a. The micro light-emitting devices 100a may emit lights of different colors. More specifically, the display apparatus 200a of this embodiment is further provided with a data line driving circuit 220, a scan line driving circuit 230, and a control circuit 240, wherein the data line driving circuit 220 and the scan line driving circuit 230 are disposed on the driving substrate 210a and electrically connected to the driving substrate 210a. The micro light-emitting devices 100a may be driven by the data line driving circuit 220 and the scan line driving circuit 230 to emit light, and the data line driving circuit 220 and the scan line driving circuit 230 are electrically connected to the control circuit 240, so as to adjust the light-emitting sequence and time of the micro light-emitting devices 100a through design of the control circuit 240. Here, the driving substrate 210a is a complementary metal-oxide-semiconductor (CMOS) substrate, a liquid crystal on silicon (LCOS) substrate, a thin film transistor (TFT) substrate, or a substrate with a work circuit, for example, but the invention is not limited thereto.

It should be noted that, through configuration of the micro light-emitting devices 100a, the display apparatus 200a of this embodiment constitutes a pixel density of 40 to 1000 pixels per inch (PPI), so as to achieve better resolution. Moreover, although the display apparatus 200a of this embodiment uses the micro light-emitting devices 100a, in other embodiments not shown here, the display apparatus may use the micro light-emitting devices 100b, 100c, 100d, 100e, 100f, 100g, 100h, 100i, 100j, 100k, 100m, and 100n as required, so as to achieve the desired effects. Nevertheless, the invention is not limited thereto.

Figure 13:
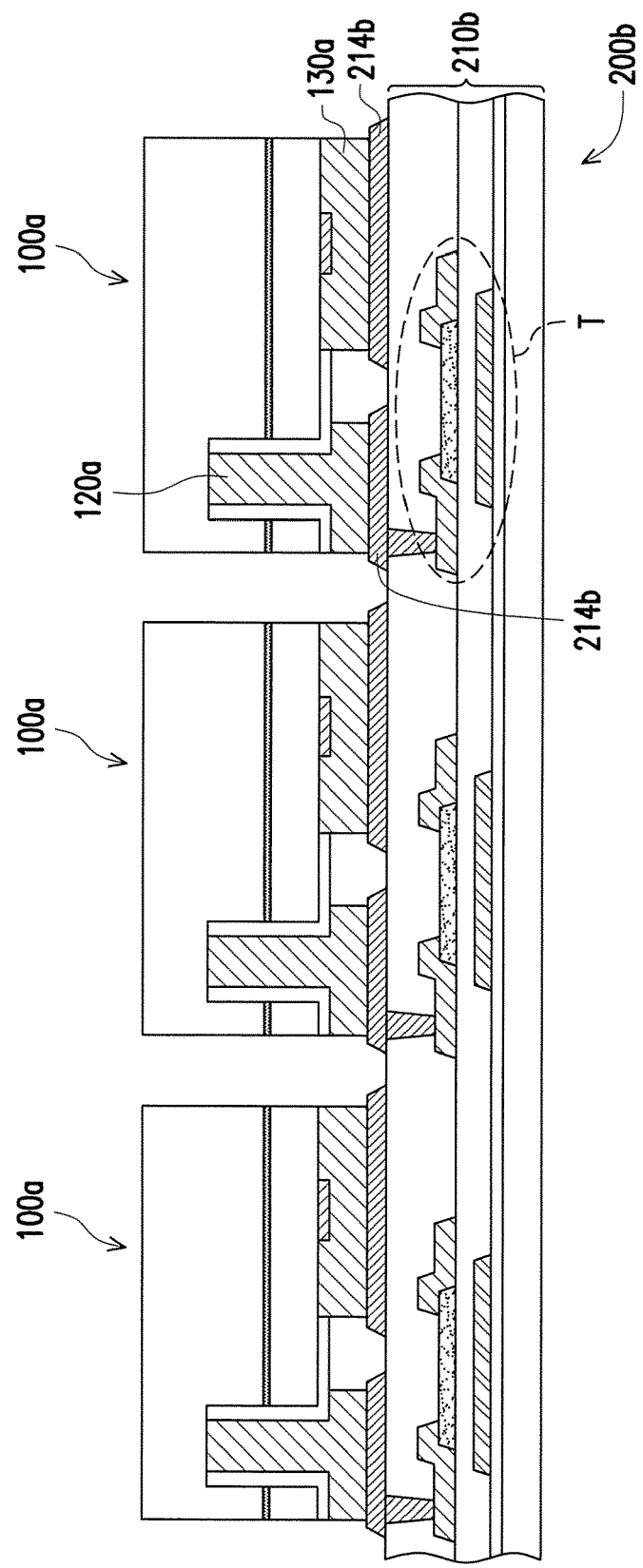
FIG. 13 is a cross-sectional view of a display apparatus according to another embodiment of the invention.

FIG. 13 is a cross-sectional view of a display apparatus according to another embodiment of the invention. Referring to FIG. 12B and FIG. 13, a display apparatus 200b of this embodiment is similar to the display apparatus 200a of FIG. 12B, and a difference therebetween is that: a driving substrate 210b of this embodiment further includes a plurality of circuit electrodes 214b, and the first type pads 120a and the second type pads 130a of the micro light-emitting devices 100a are respectively electrically connected to the circuit electrodes 214b. Herein, the driving substrate 210b is embodied as a thin film transistor substrate, and the circuit electrodes 214b are electrically connected to a thin film transistor structure T.

In conclusion, the current commanding structure of the micro light-emitting device of the invention has a smaller contact resistance with the second type semiconductor layer disposed in the epitaxial structure, so as to further concentrate the current in the region where the current commanding structure is disposed, and thereby improve the light-emitting efficiency of the micro light-emitting device. Moreover, the display apparatus using the micro light-emitting device of the invention has better display quality.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A micro light-emitting device, comprising:
   an epitaxial structure, comprising:
      a first type semiconductor layer;
      a light-emitting layer disposed on the first type semiconductor layer; and
      a second type semiconductor layer disposed on the light-emitting layer;
   a first type pad disposed on the epitaxial structure and electrically connected to the first type semiconductor layer;
   a second type pad disposed on the epitaxial structure and electrically connected to the second type semiconductor layer; and
   a current commanding structure disposed between the second type semiconductor layer and the second type pad, wherein the current commanding structure is a metal oxide, and the current commanding structure directly contacts one part of the second type semiconductor layer, wherein a contact resistance between the second type semiconductor layer and the current commanding structure is smaller than a contact resistance between the second type semiconductor layer and the second type pad, and an orthogonal projection area of the current commanding structure on the second type semiconductor layer is smaller than an orthogonal projection area of the second type pad on the second type semiconductor layer,
   wherein a contact area between the current commanding structure and the second type semiconductor layer is greater than a contact area between the current commanding structure and the second type pad.

2. The micro light-emitting device according to claim 1, wherein the current commanding structure and the second type semiconductor layer form ohmic contact.

3. The micro light-emitting device according to claim 1, wherein a ratio of the orthogonal projection area of the current commanding structure on the second type semiconductor layer to the orthogonal projection area of the second type pad on the second type semiconductor layer is in a range of 0.1 to 0.9.

4. The micro light-emitting device according to claim 1, wherein a work function of the current commanding structure is greater than a work function of the second type semiconductor layer.

5. The micro light-emitting device according to claim 1, wherein a work function of the current commanding structure is greater than a work function of the second type pad.

6. The micro light-emitting device according to claim 1, wherein a ratio of a thickness of the second type pad to a thickness of the current commanding structure is in a range of 2 to 400.

7. The micro light-emitting device according to claim 1, wherein a thickness of the current commanding structure is in a range of 5 nm to 200 nm.

8. The micro light-emitting device according to claim 1, wherein a ratio of the orthogonal projection area of the second type pad on the second type semiconductor layer to an area of the second type semiconductor layer is in a range of 0.1 to 0.9.

9. The micro light-emitting device according to claim 1, wherein the current commanding structure comprises a film or a patterned structure.

10. The micro light-emitting device according to claim 1, wherein a ratio of a horizontal distance between the current commanding structure and a closest edge of the second type semiconductor layer to a maximum width of the micro light-emitting device is greater than or equal to 0.01.

11. The micro light-emitting device according to claim 10, wherein the horizontal distance between the current commanding structure and the closest edge of the second type semiconductor layer is greater than or equal to 1 µm.

12. The micro light-emitting device according to claim 1, wherein the current commanding structure is embedded in the second type semiconductor layer.

13. The micro light-emitting device according to claim 1, wherein the first type pad and the second type pad are located on the same side of the light-emitting layer, and the epitaxial structure further comprises a through hole that sequentially penetrates the second type semiconductor layer, the light-emitting layer, and a portion of the first type semiconductor layer, and the first type pad is disposed in the through hole and electrically connected to the first type semiconductor layer.

14. The micro light-emitting device according to claim 1, further comprising:
an insulating layer disposed on a surface of the second type semiconductor layer, wherein the insulating layer has an opening that exposes a portion of the surface of the second type semiconductor layer, and the second type pad is disposed on the opening and electrically connected to the second type semiconductor layer.

15. The micro light-emitting device according to claim 14, wherein the current commanding structure is disposed on the surface of the second type semiconductor layer exposed by the opening, and located between the second type semiconductor layer and the second type pad.

16. The micro light-emitting device according to claim 1, wherein the first type semiconductor layer is an N type semiconductor layer while the second type semiconductor layer is a P type semiconductor layer.

17. The micro light-emitting device according to claim 1, wherein the second type pad comprises a plurality of second type sub-pads that are electrically insulated from one another, and the current commanding structure comprises a plurality of patterned structures correspondingly located between the second type sub-pads and the second type semiconductor layer respectively.

18. The micro light-emitting device according to claim 1, wherein a current density of a region of the epitaxial structure corresponding to the current commanding structure is greater than a current density of a region of the epitaxial structure where the current commanding structure is not disposed.

19. The micro light-emitting device according to claim 1, wherein a material of the current commanding structure is different from a material of the second type pad.

20. A display apparatus, comprising:
a driving substrate comprising a plurality of pixel regions; and
a plurality of the micro light-emitting devices of claim 1, electrically connected onto the driving substrate, wherein at least one of the micro light-emitting devices is disposed in each of the pixel regions.

* * * * *